(12) United States Patent
Sirinorakul et al.

(10) Patent No.: US 8,013,437 B1
(45) Date of Patent: Sep. 6, 2011

(54) PACKAGE WITH HEAT TRANSFER

(75) Inventors: Saravuth Sirinorakul, Bangkok (TH); Somchai Nondhasitthichai, Bangkok (TH)

(73) Assignee: Utac Thai Limited, Bangkok (TH)

( * ) Notice: Subject to any disclaimer, the term of this patent is extended or adjusted under 35 U.S.C. 154(b) by 53 days.

(21) Appl. No.: 11/899,189

(22) Filed: Sep. 4, 2007

Related U.S. Application Data (60) Provisional application No. 60/847,434, filed on Sep. 26, 2006.

(51) Int. Cl.
 H01L 23/10 (2006.01)
 H01L 23/34 (2006.01)

(52) U.S. Cl. .................. 257/707; 257/E23.101

(58) Field of Classification Search .............. 257/707, 257/E23.101
 See application file for complete search history.

(56) References Cited

U.S. PATENT DOCUMENTS

| | | |
|---|---|---|
| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,247,248 A | 9/1993 | Fukunaga |
| 5,248,075 A | 9/1993 | Young et al. |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,990,692 A | 11/1999 | Jeong et al. |
| 6,072,239 A | 6/2000 | Yoneda et al. ............... 257/730 |
| 6,111,324 A | 8/2000 | Sheppard et al. |
| 6,159,770 A | 12/2000 | Tetaka et al. ................. 438/112 |
| 6,229,200 B1 | 5/2001 | Mclellan et al. |
| 6,242,281 B1 | 6/2001 | Mclellan et al. |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. ........... 257/698 |
| 6,353,263 B1 | 3/2002 | Dotta et al. |
| 6,376,921 B1 | 4/2002 | Yoneda et al. ............... 257/787 |
| 6,392,427 B1 | 5/2002 | Yang |
| 6,414,385 B1 * | 7/2002 | Huang et al. ................. 257/690 |
| 6,429,048 B1 | 8/2002 | McLellan et al. |
| 6,451,709 B1 * | 9/2002 | Hembree ...................... 438/759 |

(Continued)

OTHER PUBLICATIONS

U.S. Appl. No. 11/788,496, Somchai Nondhasitthichai et al.

(Continued)

*Primary Examiner* — Jenny L Wagner
(74) *Attorney, Agent, or Firm* — Haverstock & Owens LLP (57) ABSTRACT

A semiconductor package includes an encapsulant, a semiconductor die within the encapsulant, and a terminal for electrically coupling the semiconductor die to a node exterior to the package. The package further includes solder coupling the semiconductor die to the terminal. The semiconductor package is configured to dissipate heat through a top surface of the package. To directly dissipate heat via the top surface of the package, a portion of the semiconductor die is preferably exposed at the top surface of the package. Alternatively, instead of having a semiconductor device or die directly exposed at a surface of the package, a layer of thermally conductive material is coupled to the semiconductor device, and the layer is exposed at a surface of the package.

20 Claims, 8 Drawing Sheets

U.S. PATENT DOCUMENTS

| | | |
|---|---|---|
| 6,455,348 B1 | 9/2002 | Yamaguchi |
| 6,489,218 B1 | 12/2002 | Kim et al. |
| 6,498,099 B1 | 12/2002 | McLellan et al. |
| 6,507,116 B1 * | 1/2003 | Caletka et al. ............... 257/778 |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. ............... 438/106 |
| 6,585,905 B1 | 7/2003 | Fan et al. |
| 6,586,834 B1 | 7/2003 | Sze et al. |
| 6,635,957 B2 | 10/2003 | Kwan et al. |
| 6,667,191 B1 | 12/2003 | McLellan et al. |
| 6,686,667 B2 | 2/2004 | Chen et al. |
| 6,703,696 B2 | 3/2004 | Ikenaga et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 * | 7/2004 | Wu et al. ............... 438/123 |
| 6,781,242 B1 | 8/2004 | Fan et al. |
| 6,800,948 B1 | 10/2004 | Yeung et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,897,428 B2 | 5/2005 | Minamio et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,205,178 B2 | 4/2007 | Shiu et al. |
| 7,224,048 B1 | 5/2007 | McLellan et al. |
| 7,247,526 B1 | 7/2007 | Fan et al. ............... 438/123 |
| 7,274,088 B2 | 9/2007 | Wu et al. |
| 7,314,820 B2 | 1/2008 | Lin et al. |
| 7,315,080 B1 * | 1/2008 | Fan et al. ............... 257/717 |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 * | 8/2008 | Hata et al. ............... 257/678 |
| 7,411,289 B1 | 8/2008 | McLellan et al. |
| 7,449,771 B1 | 11/2008 | Fan et al. |
| 7,482,690 B1 | 1/2009 | Fan et al. |
| 7,595,225 B1 | 9/2009 | Fan et al. |
| 7,714,418 B2 | 5/2010 | Lim et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2004/0014257 A1 | 1/2004 | Kim et al. |
| 2004/0046237 A1 | 3/2004 | Abe et al. |
| 2004/0046241 A1 | 3/2004 | Combs et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2010/0327432 A1 | 12/2010 | Sirinorakul et al. |

OTHER PUBLICATIONS

U.S. Appl. No. 11/731,522, Saravuth Sirinorakul et al.
U.S. Appl. No. 12/002,054, Somchai Nondhasitthichai et al.
U.S. Appl. No. 12/002,186, Somchai Nondhasitthichai et al.
U.S. Appl. No. 12/002,187, Somchai Nondhasitthichai et al.
U.S. Appl. No. 12/154,483, Saravuth Sirinorakul et al.
U.S. Appl. No. 12/231,710, Saravuth Sirinorakul et al.
U.S. Appl. No. 12/287,174, Saravuth Sirinorakul et al.
U.S. Appl. No. 12/378,119, Somchai Nondhasitthichai et al.
U.S. Appl. No. 12/383,135, Somchai Nondhasitthichai et al.
Office Action dated Nov. 4, 2010, U.S. Appl. No. 12/868,560, filed Aug. 25, 2010, Saravuth Sirinorakul et al.
Michael Quirk and Julian Serda, Semiconductor Manufacturing Technology, Pearson Education International, Pearson Prentice Hall , 2001, p. 587-588.

* cited by examiner

PACKAGE WITH HEAT TRANSFER

RELATED APPLICATIONS

This application claims benefit of priority under 35 U.S.C. section 119(e) of U.S. Provisional Patent Application 60/847,434 filed Sep. 26, 2006, which is incorporated herein by reference.

FIELD OF THE INVENTION

The present invention is in the field of semiconductor packaging and is more specifically directed to package with heat transfer.

BACKGROUND

Modern semiconductor packages continue to become smaller due to improvements in fabrication technology. Yet these smaller packages are more densely packed with circuitry and components that often run much faster than their predecessors. These improvements typically increase the amount of heat generated within the package, while reducing the amount of exterior surface area available for the dissipation of heat. The factors of small size and high speed circuitry contribute to certain undesirable conditions for the operation of modern packages. For instance, semiconductor performance and reliability are directly related to the operating temperature interior and exterior to the package, and thus performance and reliability are also related to the ability to dissipate heat, from the package.

Conventionally, heat reduction is achieved by the inclusion of additional interior and/or exterior heat sinks that undesirably affect the overall form factor of the package. However, as mentioned above, with modern packages, the interior space within the package, or the exterior space for the placement of the package, or both, are often heavily constrained. For example, in small form factor applications such as mobile technology, the overall form factor of a mobile device is so small that there are both profile or height constraints, as well as board surface area constraints, for the onboard electronics.

SUMMARY OF THE DISCLOSURE

A semiconductor package includes an encapsulant, a semiconductor die within the encapsulant, and a terminal for electrically coupling the semiconductor die to a node exterior to the package. The package further includes solder coupling the semiconductor die to the terminal. The semiconductor package is configured to dissipate heat through a top surface of the package. To directly dissipate heat via the top surface of the package, a portion of the semiconductor die is preferably exposed at the top surface of the package.

Alternatively, a package for a semiconductor device includes the semiconductor device, and one or more terminals coupled to the semiconductor device. A portion of one or more of the terminals is exposed at a surface of the package. Instead of having a semiconductor device or die directly exposed at a surface of the package, a thermal cushion is coupled to the semiconductor device. The thermal cushion is formed by using a thermally conductive epoxy, that is preferably located near the top surface of the package. A molding compound encapsulates the semiconductor device.

Typically, the epoxy is exposed at an exterior of the package, and is preferably of the thermally conductive type. In some packages, the epoxy has a width dimension that approximates the dimensions of a surface of the package. Alternatively, the epoxy has a width dimension that is less than the dimensions of a surface of the package such as, for instance, the width of the die. The terminal is coupled to the semiconductor device by using solder, which has a variety of shapes, including solder balls and/or pillars, for example.

Alternatively, or in conjunction with the thermal epoxy, the package of some embodiments includes a cap coupled to the semiconductor device. Typically, the cap is coupled to the semiconductor device by using thermally conductive epoxy. The cap is generally formed by using a thermally conductive material, such as a metal, for example. The cap has a dimension that approximates a dimension of an exterior surface of the package, or alternatively, the cap has a dimension that is less than an exterior dimension of the package. Typically, the epoxy forms a layer that is approximately the width of the cap, or the epoxy forms a layer that is approximately the width of the semiconductor device.

In some implementations, the cap has a dimension that varies from the interior to the exterior of the package. For instance, where the cap comprises a step, a smaller portion of the cap faces the interior of the package, while a larger portion of the cap faces the exterior of the package to aid in heat dispersion. As another example, the cap has a tapered shape that broadens toward the exterior surface of the package. In some cases, the cap comprises an interlocking feature that is formed by using a step and/or a tapered shape. Preferably, in these cases, the smaller portion of the cap is located near the exterior of the package, while the larger portion is located near the interior of the package.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

In a particular embodiment of the invention, a package is configured to dissipate heat during operation via a bottom side and/or a top side of the package. For packages that dissipate heat from a bottom side, solder balls bring the heat from the semiconductor die through the metal terminals and/or through the exposed die attach pads to the printed circuit board (PCB). Alternatively, pillar bumps, rather than solder balls, transfer heat from the die through the metal terminals and/or exposed die attach pads to the printed circuit board.

Figure 1:
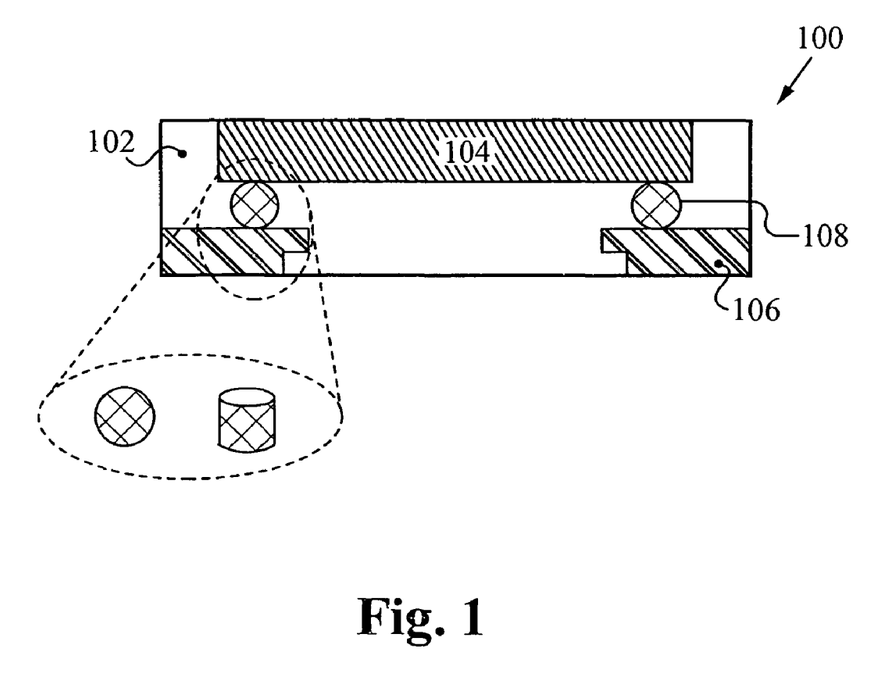
FIG. 1 illustrates a package for heat transfer via an exposed semiconductor device.

For packages that dissipate heat from a top side, at least one side of the die is exposed to the outside environment. Hence, in these packages, heat transfer is achieved via the die body itself. FIG. 1 illustrates an exemplary embodiment. As shown in this figure, the package 100 includes a molding 102 that encapsulates at least a portion of a semiconductor device 104, such as a die, and one or more terminals 106. A bonding means 108 electrically couples the semiconductor device 104 to one or more of the terminals 106. Preferably, the bonding 108 provides for thermal transfer from the semiconductor device 104 and the terminal 106. The semiconductor device 104 and/or one or more of the terminals 106 are positioned at or near a surface of the package 100, such that heat from the semiconductor device 104 is advantageously transferred to the exterior of the package 100, via the top of the package 100, or the bottom, or both.

In certain instances, it is preferable that the semiconductor device is not directly exposed at the exterior of the package. Hence, alternatively, the semiconductor device is coupled to another structure that is exposed at one or more surface of the package. For instance, the additional structure includes a thermally conductive layer, which has one side exposed to the outside environment. The thermally conductive layer is typically formed by using conductive epoxy or a metal cap.

Some of the packages that employ heat transfer via a thermal conductive layer at the top of the package, use a thermal epoxy that has shock and/or force absorbing properties. In these packages, the thermal conductive layer not only helps to transfer heat from the semiconductor die to the outside environment, but also serves as a cushion to absorb impact to the die. Such impact often occurs during mold cavity clamp of the molding process.

According to some packages of the invention heat transfer is advantageously achieved by two routes, such as via a thermal conductive layer on top, and also via a bottom exposed pad. In these packages, the exposed die attach pad at the bottom of the package encourages efficient heat transfer to the printed circuit board, while the thermal conductive layer has a variety of applications at the top surface of the package. For instance, the top layer of some embodiments advantageously provides for coupling to another structure and/or node external to the top surface of the package.

Alternatively, or in conjunction with an epoxy type material, the thermal conductive layer at the top of the package is formed by using a metal cap. The metal material is selected, at least in part, based on its ability to enhance the dissipation of heat. Further, the top exposed thermal conductive layer of various embodiments is formed into a variety of advantageous shapes. For instance, the die of some packages are small. Hence, the ability of these small die to transfer heat through a bottom exposed pad is limited. However, for these cases, a heat conductive layer is preferably added near the top of the package, to advantageously disperse and/or transfer heat toward the top surface of the package. The top conductive layer is preferably formed by using an epoxy and/or a metal cap that is advantageously malleable to meet the particular size and/or shape requirements for the smaller die. Moreover, it is often advantageous that the top exposed thermal layer itself has a small or other particular shape. Further, the various shapes and sizes of the top exposed thermal layer are combined with one or more bottom exposed features such as a die attach pad, for increased and/or maximized thermal transfer. Examples of certain embodiments of the invention are further described below, by reference to the figures.

Top Exposed Layer

Figure 1A:
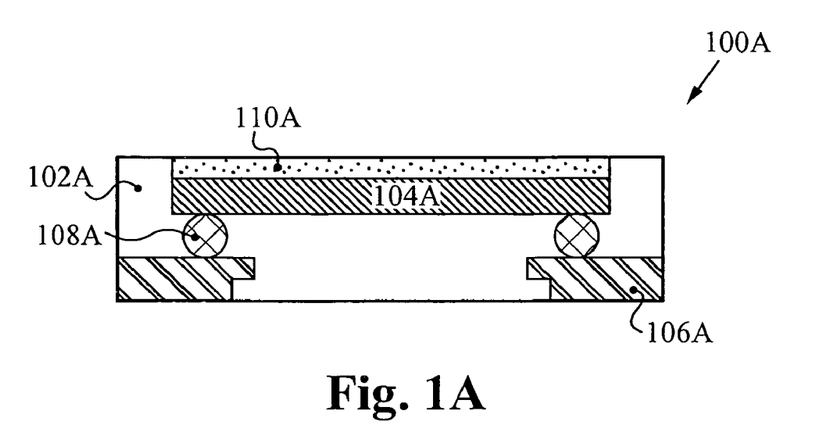
FIG. 1A illustrates a package for heat transfer via a thermal conductive epoxy cushion on top.

Embodiments employing a top exposed layer and/or a thermal cushion are further described in relation to FIG. 1A. More specifically, FIG. 1A illustrates a package 100A for heat transfer via a thermally conductive layer 110A near a top surface of the package. As shown in this figure the package 100A includes a molding compound 102A that is typically a plastic or resin type material, that encapsulates a semiconductor device 104A such as a die.

The semiconductor device 104A is preferably electrically coupled to one or more terminals 106A by using a bonding means 108A. One of ordinary skill recognizes a variety of bonding means such as, for example, solder balls, pillar bumps, and/or bonding wires. However, the bonding means is advantageously selected for the ability to transfer heat. Preferably, the layer 110A is formed by using a thermally conductive epoxy such as AbleStick 84-3. The layer 110A of these embodiments advantageously receives heat from the semiconductor device 104A and transfers the heat to a location that is external to the package 100A.

Figure 2:
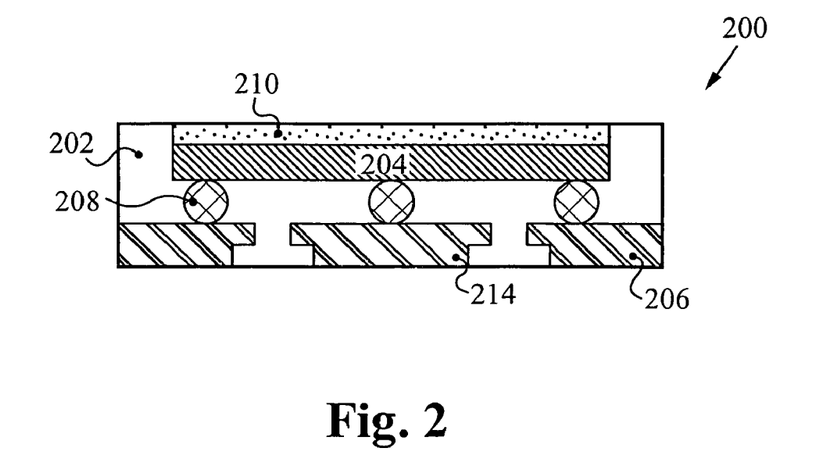
FIG. 2 illustrates a package for heat transfer via a thermal conductive epoxy cushion on top with a bottom exposed pad.

FIG. 2 illustrates a package 200 for heat transfer via a cushion 210 with a bottom exposed pad 214. Preferably, the cushion 210 is formed by using a thermally conductive epoxy that is coupled to a semiconductor device 204. The cushion 210 advantageously conducts heat from within the package 200, to an external location. Since in these embodiments, the thermal cushion 210 is located near a top surface of the package 200, heat is advantageously transferred from the semiconductor device 204, without affecting the electrical and/or thermal contacts at the bottom surface of the package 200. Moreover, space is typically in short supply at a bottom surface of these packages 200, as illustrated by the inclusion of the pad 214 and contact leads and/or terminals 206 in FIG. 2.

Metal Cap

Figure 3:
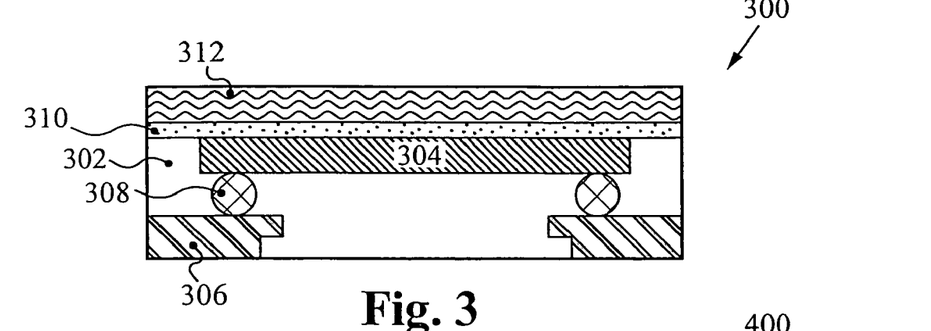
FIG. 3 illustrates a package for heat transfer via a metal cap on top.

FIG. 3 illustrates a package 300 for heat transfer via a metal cap 312 on top. As shown in this figure, the metal cap 312 is exposed at a surface of the package 300, and is coupled within the interior of the package 300 to a semiconductor device 304 by using a layer of thermal epoxy 310.

Figure 4:
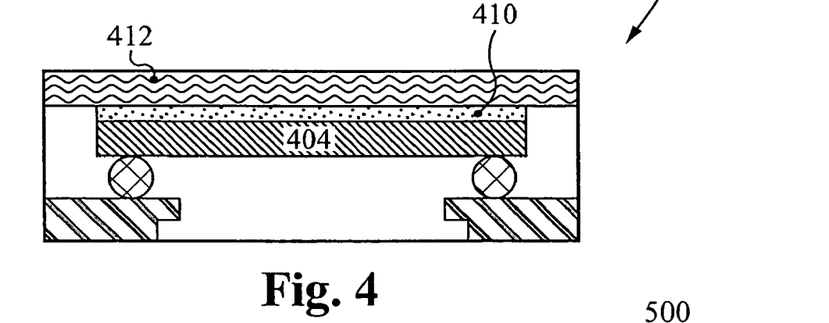
FIG. 4 illustrates an alternative implementation of the package of FIG. 3.

FIG. 4 illustrates an alternative implementation 400 of the package 300 of FIG. 3. In the implementation 400 of FIG. 4, the layer of thermal epoxy 410 spans the width of the semiconductor device 404.

Figure 5:
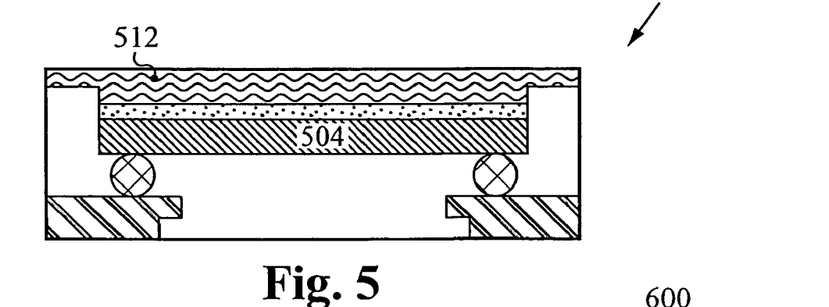
FIG. 5 illustrates an alternative implementation of the package of FIG. 4.

FIG. 5 illustrates an alternative implementation 500 of the package 400 of FIG. 4. In the implementation 500 of FIG. 5, the metal cap 512 has a variety of widths for different portions of the metal cap 512. For instance, in this figure the metal cap 512 has the width of the package 500 at the external surface, while the metal cap 512 has the width of the semiconductor device 504 at the internal surface of the metal cap 512 that is within the interior of the package 500. As mentioned above, such a configuration 500 maximizes the surface area coupling the thermal transfer layer 512, and also maximizes the surface area of the thermal transfer layer 512 exposed at the top surface of the package 500.

Figure 6:
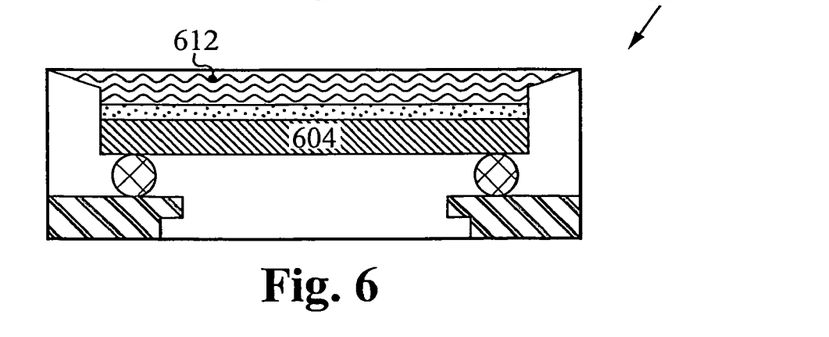
FIG. 6 illustrates an alternative implementation of the package of FIG. 5.

FIG. 6 illustrates an alternative implementation of the package 500 of FIG. 5. As shown in FIG. 6, the shape of the metal cap 612 includes a variety of features, such as the gradual tapering from the width of the semiconductor device 604 internal to the package 600 to the width of the package 600 at its exterior. Such a configuration further includes particular advantages in the use of space within the package 600, while promoting efficient heat transfer to the exterior of the package 600.

Metal Cap for Small Die

Figure 7:
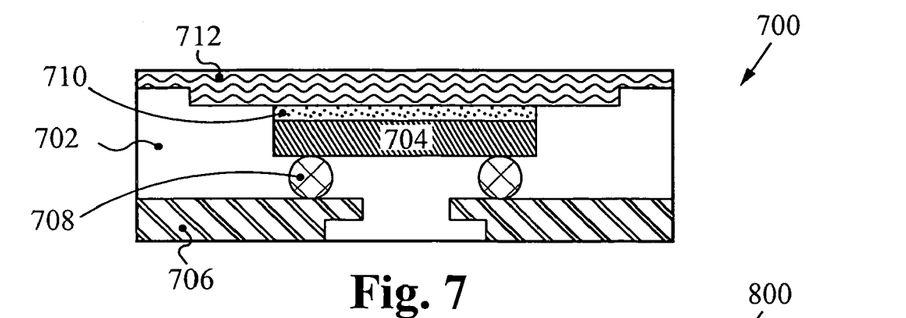
FIG. 7 illustrates a small die version of package for heat transfer via a metal cap on top.

FIGS. 7 through 10 illustrate that embodiments of the invention are suitable for packages having small semiconductor devices. For instance, FIG. 7 illustrates a metal cap 712 coupled to a small semiconductor device such as a small die 704 by using a thermal epoxy 710. The epoxy 710 and the metal cap 712 advantageously conduct heat from the small die 704 and transfer the heat to a location exterior to the package 700.

Figure 8:
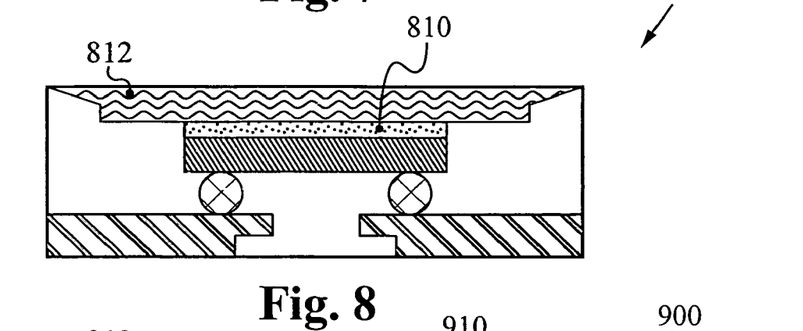
FIG. 8 illustrates an alternative implementation of the package of FIG. 7.

FIG. 8 illustrates an alternative implementation 800 of the package 700 of FIG. 7. In the implementation 800 of FIG. 8, the metal cap 812 has a tapered shape. In FIGS. 7 and 8, the layers of epoxy 710 and 810 extend and/or are applied first to the dimensions of the small die 704. In contrast, in FIGS. 9 and 10 the thermal epoxy layers 910 and 1010 extend and/or are applied first to the dimensions of the metal caps 912 and 1012.

Figure 9:
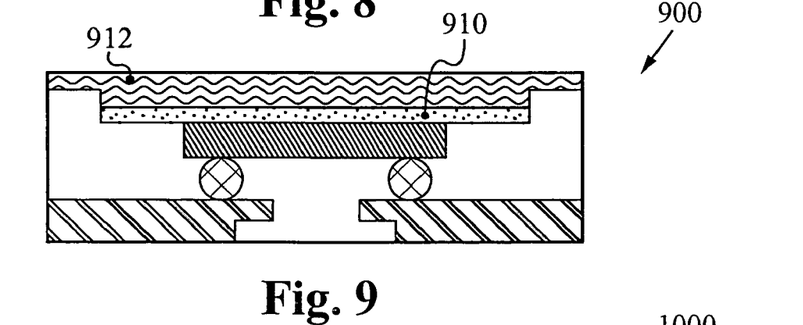
FIG. 9 illustrates an alternative implementation of the package of FIG. 7.
Figure 10:
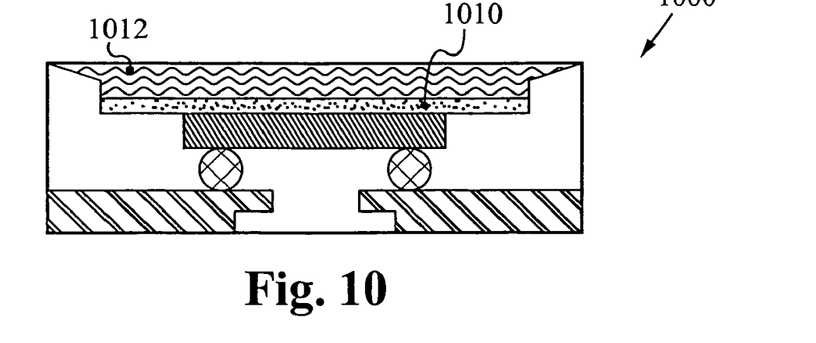
FIG. 10 illustrates an alternative implementation of the package of FIG. 9.

More specifically, FIG. 9 illustrates a thermally conductive layer 910 that has an alternative shape or dimension than the layer 710 of the package 700 of FIG. 7. Similarly, FIG. 10 illustrates a thermally conductive layer 1010 that has an alternative dimension for the layer 810 of the package 800 of FIG. 8. Hence, as further shown in these figures, the interface between the semiconductor device, the thermal transfer layer, and the exterior of the package has a variety of dimensions to meet the needs of a variety of package specifications and/or applications. The packages described above, are also selectively used in conjunction with additional mechanisms for heat transfer, for example, at a bottom surface of the package.

Exposed Pad

Figure 11:
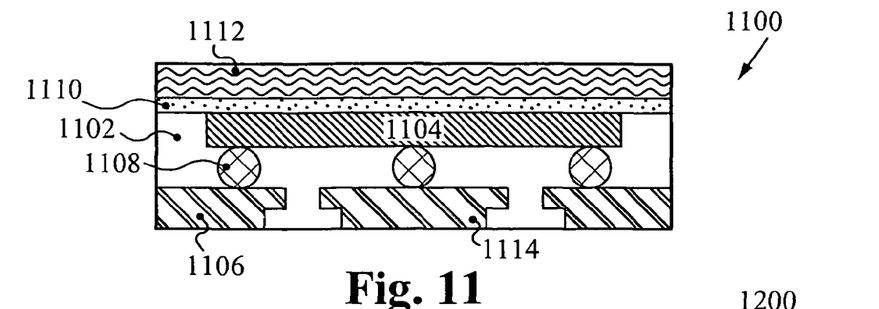
FIG. 11 illustrates a package for heat transfer via a metal cap on top with a bottom exposed pad.

FIG. 11 illustrates a package 1100 for heat transfer via a metal cap 1112 with a bottom exposed pad 1114. As described above, the metal cap 1112 is preferably located near a top portion of the package 1100. A semiconductor device 1104 is preferably coupled to the metal cap 1112 by using a layer 1110 of thermally conductive epoxy. The semiconductor device 1104 is further preferably coupled to the pad 1114 and/or one or more terminals 1106. Typically, the couplings are formed by using thermally and/or electrically conducting bonds, such as by the solder 1108 illustrated in FIG. 11.

Figure 12:
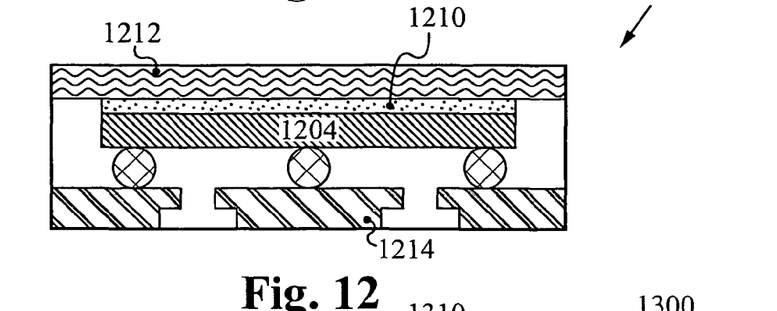
FIG. 12 illustrates an alternative implementation of the package of FIG. 11.

FIG. 12 illustrates an alternative implementation 1200 of the package 1100 of FIG. 11. In the implementation 1200 of FIG. 12, the layer of epoxy 1210 has the width of the semiconductor device 1204.

Figure 13:
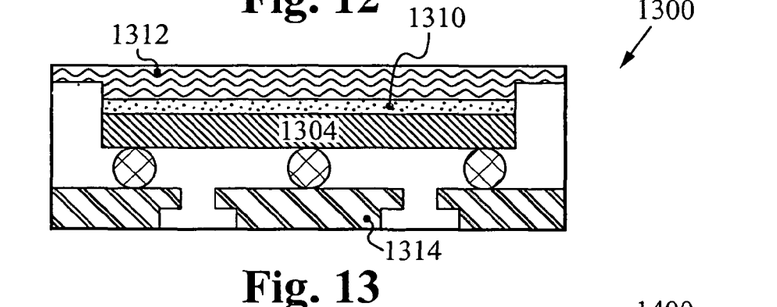
FIG. 13 illustrates an alternative implementation of the package of FIG. 12.

FIG. 13 illustrates an alternative implementation 1300 of the package 1200 of FIG. 12. In the implementation 1300 of FIG. 13, the metal cap 1312 has a wider width at an exterior of the package 1300 than at the interface 1310 with the semiconductor device 1304, where the metal cap 1312 preferably has the width of the semiconductor device 1304. In the illustrated implementation 1300, the metal cap 1312 includes a step shape.

Figure 14:
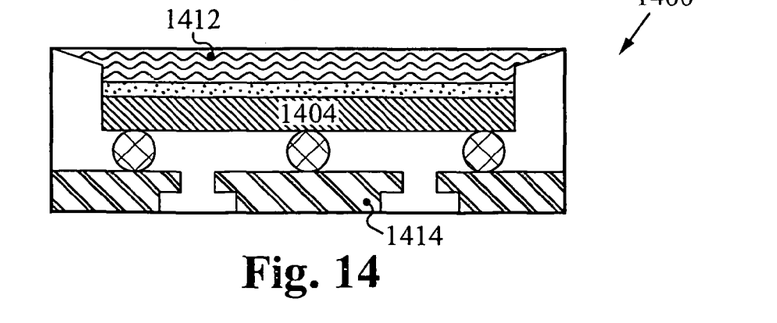
FIG. 14 illustrates an alternative implementation of the package of FIG. 13.

FIG. 14 illustrates an alternative implementation 1400 of the package 1300 of FIG. 13. The implementation 1400 of FIG. 14 includes a metal cap 1412 that has a tapered shape. Thus, the metal cap of different embodiments has a variety of shapes, which provide space savings and/or promote efficient heat transfer for example. Moreover, the packages 1100, 1200, 1300, and 1400, include both a thermal transfer layer near the top of the package, and bottom exposed terminals and die pad, for improved heat transfer via a plurality of routes.

Small Metal Cap

Figure 15:
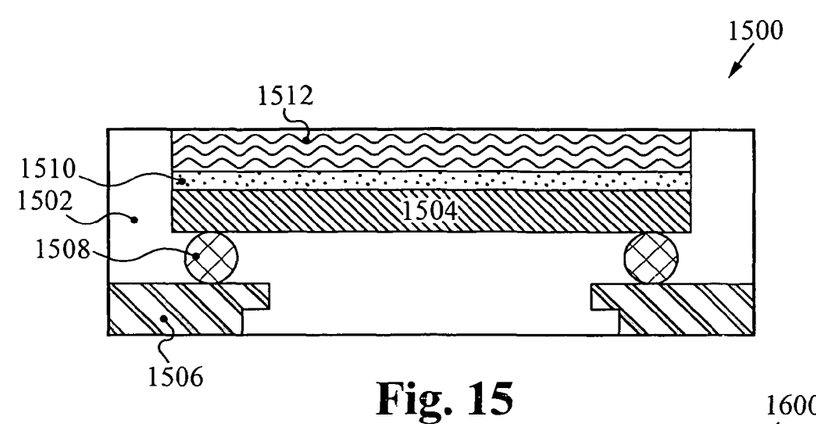
FIG. 15 illustrates a package for heat transfer via a small metal cap on top.

FIG. 15 illustrates a package 1500 for heat transfer via a small metal cap 1512 that is exposed at a top surface of the package 1500. The metal cap 1512 has a width that is approximately the width of a semiconductor device 1504 to which it is coupled by using a thermal epoxy 1510. In this implementation, the dimensions of the metal cap 1512 are less than the dimensions of the surface of the package 1500 at which the metal cap 1512 is exposed. For instance, the metal cap 1512 of some embodiments has dimensions 0.7 by 0.7 millimeters, while the package 1500 of these embodiments has dimensions of about 1 by 1 millimeters.

Figure 16:
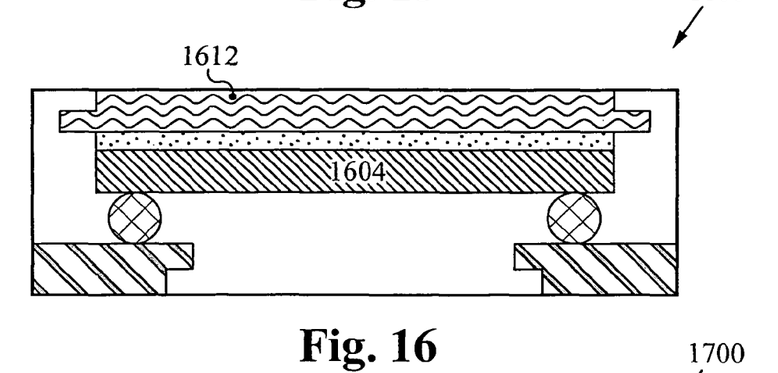
FIG. 16 illustrates an alternative implementation of the package of FIG. 15.

FIG. 16 illustrates an alternative implementation 1600 of the package 1500 of FIG. 15. As shown in FIG. 16, the package 1600 includes a cap 1612 that has an interlocking feature such as a step at one or more edges of the cap 1612. The interlocking feature is preferably embedded within the encapsulant of the package 1600 to advantageously minimize separation of the metal cap 1612 from the package 1600.

Figure 17:
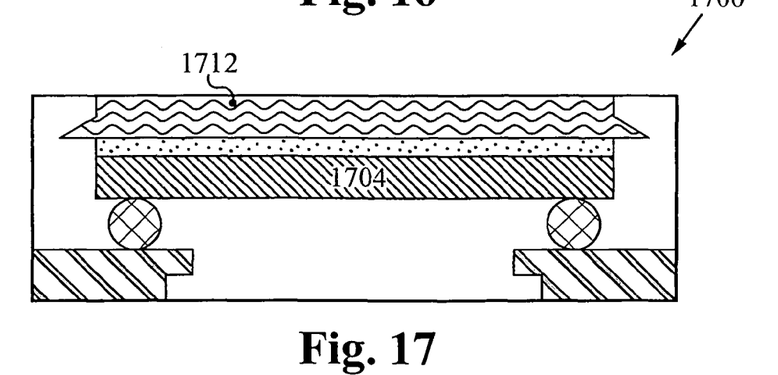
FIG. 17 illustrates an alternative implementation of the package of FIG. 16.

FIG. 17 illustrates an alternative implementation 1700 of the package 1600 of FIG. 16. As shown in FIG. 17, the metal cap 1712 of different embodiments has an interlocking feature that employs a variety of shapes to achieve improved resistance to separation from the package 1700.

Small Metal Cap and Exposed Die Pad

Figure 18:
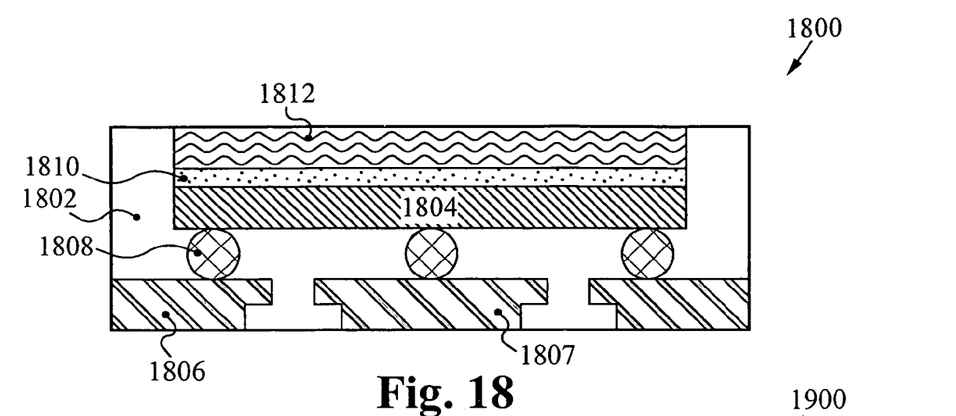
FIG. 18 illustrates a package for heat transfer via a small metal cap on top with a bottom exposed pad.

FIG. 18 illustrates a package 1800 for heat transfer via a small metal cap 1812 on top with a bottom exposed die pad 1807. As shown in this figure, the molding compound 1802 encapsulates a semiconductor device 1804 that is bonded on one surface to one or more terminals 1806 and to a die pad 1807. Preferably, the terminal 1806 and the die pad 1807 are exposed at a surface of the package 1800. The semiconductor device 1804 is further coupled at a surface to a thermal transfer layer near the top of the package, or a cap 1812. The cap 1812 is preferably formed from a heat conducting material such as a metal, and is also exposed at a surface of the package 1800 for the transfer of heat, particularly from the semiconductor device 1804 within the package 1800 advantageously to a location external to the package 1804.

Figure 19:
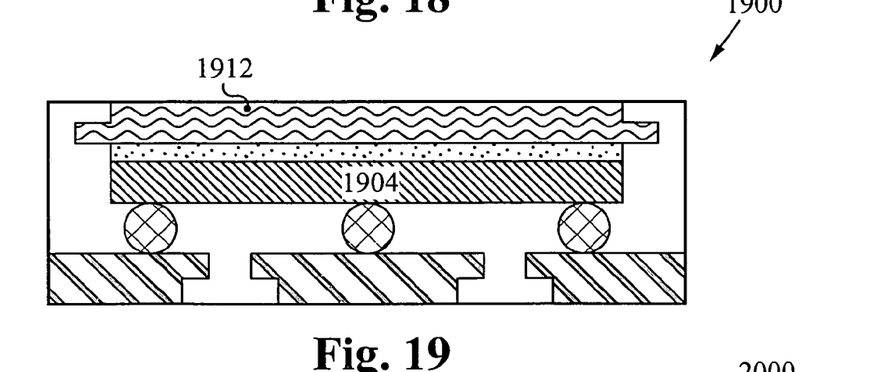
FIG. 19 illustrates an alternative implementation of the package of FIG. 18.

FIG. 19 illustrates an alternative implementation 1900 of the package 1800 of FIG. 18. As shown, the metal cap 1912 of FIG. 19 includes an interlocking feature embedded within the package 1900 to advantageously resist separation from the package 1900.

Figure 20:
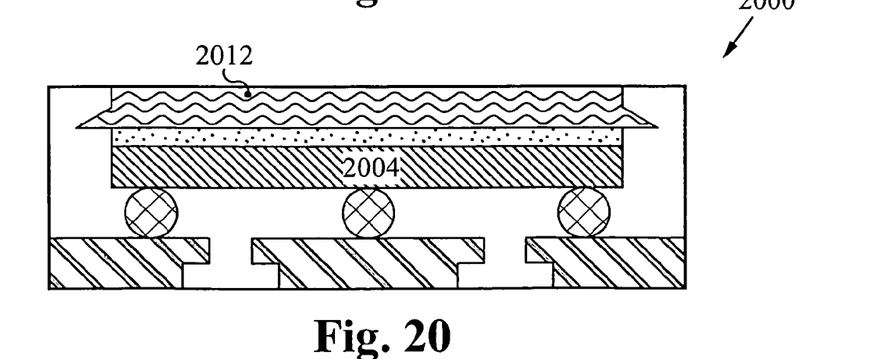
FIG. 20 illustrates an alternative implementation of the package of FIG. 19.

FIG. 20 illustrates an alternative implementation 2000 of the package 1900 of FIG. 19. As shown in FIG. 20, the interlocking lip of different embodiments has a variety of shapes that serve to prevent separation from the package 2000.

Method

Figure 21:
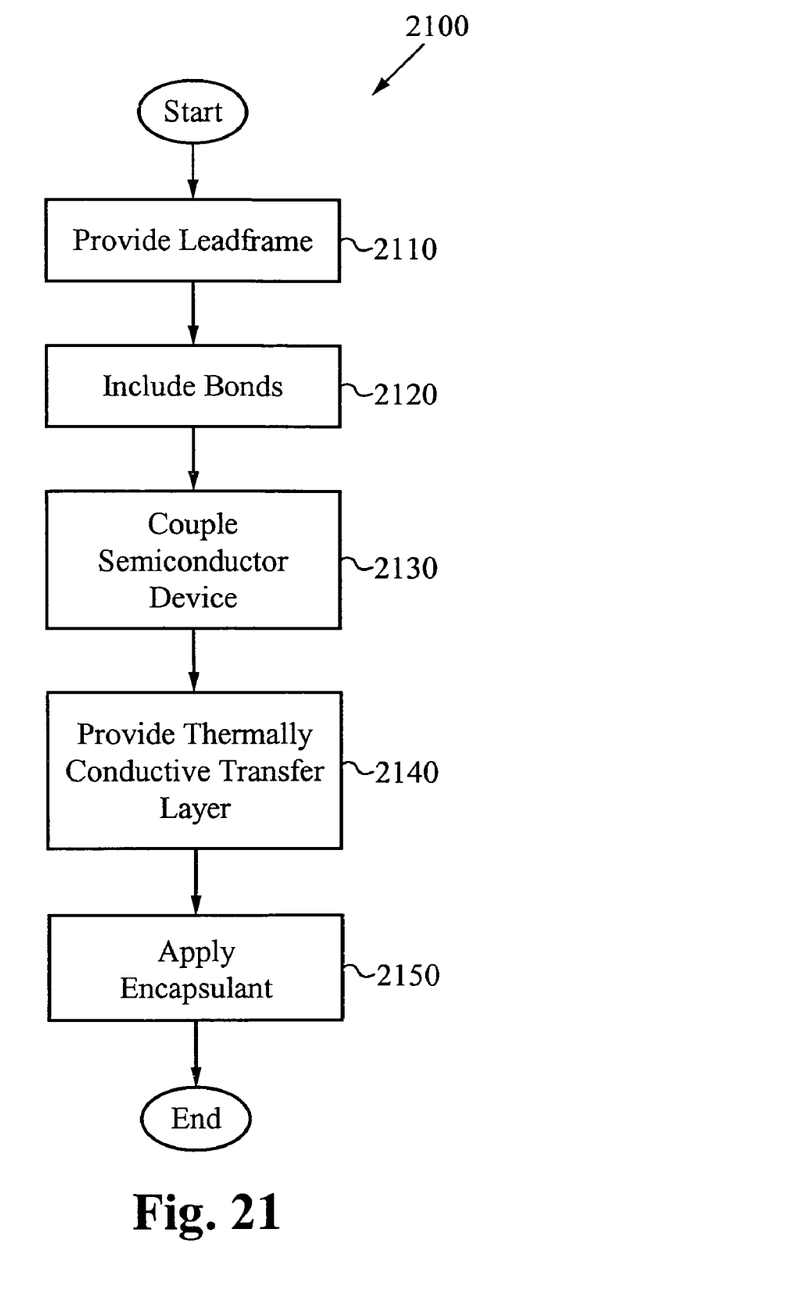

FIG. 21 is a flow illustrating a process 2100 for forming the package of some embodiments. As shown in this figure, the process 2100 begins at the step 2110, where a leadframe is provided. Typically, a leadframe is formed by etching and/or stamping a metal layer. The leadframe optionally includes one or more contact terminals and/or one or more die attach pads. Once the leadframe is provided at the step 2110, the process 2100 transitions to the step 2120, where a bonding means is coupled to the leadframe and/or to a semiconductor device. For instance, in some embodiments, solder balls are placed on a top surface of the leadframe and/or on a surface of the semiconductor device. In some embodiments, coupling is achieved by screen printing the leadframe with solder on its surface at a location of solder balls or pillar bumps. The solder balls or pillar bumps are attached to the circuit surface. Then, the process 2100 transitions to the step 2130, where the semiconductor device is attached and/or bonded to the leadframe, including the contact terminals and/or attach pads of the leadframe. As mentioned above, the bonding is performed by using solder, in some embodiments, such as in the form of solder balls and/or pillar bumps. In some embodiments, bonding is effectuated by a standard semiconductor assembly reflow process. The semiconductor device is bonded to the leadframe, the process 2100 transitions to the step 2140, where a thermal transfer layer is formed. In a particular implementation, the thermal transfer layer includes a thermally conductive cushion. The cushion of some embodiments is formed by applying a layer of thermally conductive adhesive and/or epoxy to a surface of the semiconductor device. Alternatively, some embodiments include an additional cap, and the epoxy is optionally applied to a surface of the cap. The cap is then coupled to the semiconductor device by using the layer of epoxy. Preferably, the cap comprises a material that has particular heat transference properties, such as a metal, for example.

After the cushion and/or the cap are formed and/or placed at the step 2140, the process 2100 transitions to the step 2150, where a molding compound is used to encapsulate the package. Preferably, the encapsulation at the step 2150 leaves a bottom surface of the contact terminal(s) and/or attach pad(s) exposed at the exterior of the package. Further preferably, the encapsulation leaves a top surface of the thermal transfer layer, such as the thermally conductive cushion and/or the cap, exposed at an exterior of the package. The step 2150 of some embodiments alternatively includes additional steps such as singulation, etching, and/or stamping or other means to leave the selected thermally and/or electrically conductive elements of the package exposed at the exterior surfaces.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A package for a semiconductor device, the package comprising:
   the semiconductor device;
   a terminal coupled to the semiconductor device, a portion of the terminal exposed at a surface of the package;
   a thermal cushion coupled to the semiconductor device, the thermal cushion comprising an epoxy, wherein the thermal cushion is configured to absorb impact to the semiconductor device, wherein the epoxy has a width dimension that is the same as the width of the surface of the package;
   a molding compound encapsulating the semiconductor device; and
   a cap coupled to the semiconductor device, wherein the cap has a dimension that varies from the interior to the exterior of the package, the cap comprising interlocking features located at a bottommost edge of the cap that overhangs the semiconductor device, each projecting into the molding compound.

2. The package of claim 1, wherein the epoxy is a thermally conductive epoxy.

3. The package of claim 1, wherein the epoxy has a width dimension that is less than a dimension of a surface of the package.

4. The package of claim 1, wherein the terminal is coupled to the semiconductor device by using solder.

5. The package of claim 1, wherein the cap is coupled to the semiconductor device by using thermally conductive epoxy.

6. The package of claim 1, wherein the cap comprises a thermally conductive material.

7. The package of claim 1, wherein the cap comprises metal.

8. The package of claim 1, wherein the cap has a dimension that is substantially the same as a dimension of an exterior surface of the package.

9. The package of claim 1, wherein the cap has a dimension that is less than an exterior dimension of the package.

10. The package of claim 1, wherein the cap comprises a step.

11. The package of claim 1, wherein the cap comprises a tapered shape.

12. The package of claim 1, wherein the interlocking feature comprises a step.

13. The package of claim 1, wherein the interlocking feature comprises a tapered shape.

14. The package of claim 1, further comprising a pad coupled to the semiconductor device, the pad exposed at a bottom surface of the package, such that during operation of the semiconductor device heat is transferred via the bottom surface of the package.

15. A package for a semiconductor device, the package comprising:
    the semiconductor device;
    a terminal leadframe coupled to the semiconductor device, a portion of the terminal leadframe exposed at a surface of the package;
    a thermal cushion coupled to the semiconductor device, the thermal cushion configured to absorb impact to the semiconductor device;
    a molding compound encapsulating the semiconductor device; and
    a cap coupled to the semiconductor device, wherein a smaller portion of the cap and a larger portion of the cap form interlocking features located at a bottommost edge of the cap that overhangs the semiconductor device, each extending into the molding compound, wherein the smaller portion of the cap has a width dimension that is the same as the width of the thermal cushion.

16. The package of claim 15 wherein the semiconductor device is coupled to the terminal leadframe by solder balls.

17. The package of claim 15 wherein the semiconductor device is coupled to the terminal leadframe by solder cylinders.

18. A package for a semiconductor device, the package comprising:
- the semiconductor device;
- a terminal leadframe coupled to the semiconductor device;
- a thermal cushion coupled to the semiconductor device, wherein the thermal cushion has a width that is greater than the width of the semiconductor device;
- a molding compound encapsulating the semiconductor device; and
- a cap coupled to the semiconductor device, wherein a smaller portion of the cap and a larger portion of the cap form at least one interlocking feature located at a bottommost edge of the cap that overhangs the semiconductor device, extending into the molding compound, wherein the smaller portion of the cap has a width dimension that is the same as the width of the semiconductor device.

19. The package of claim 18 wherein the semiconductor device is coupled to the terminal leadframe by solder balls.

20. The package of claim 18 wherein the semiconductor device is coupled to the terminal leadframe by solder cylinders.

* * * * *